United States Patent [19]
Hedley et al.

[11] Patent Number: 4,811,263
[45] Date of Patent: Mar. 7, 1989

[54] INFINITE IMPULSE RESPONSE FILTERS

[75] Inventors: David J. Hedley, Winchester; John Richards, Chilbolton, both of England

[73] Assignee: Sony Corporation, Tokyo, Japan

[21] Appl. No.: 911,134

[22] Filed: Sep. 24, 1986

[30] Foreign Application Priority Data

Sep. 25, 1985 [GB] United Kingdom .................. 8523655

[51] Int. Cl.$^4$ .............................................. G06F 15/31
[52] U.S. Cl. ............................ 364/724.13; 364/724.17
[58] Field of Search ................ 364/724, 724.13, 724.17

[56] References Cited

U.S. PATENT DOCUMENTS

| | | | |
|---|---|---|---|
| 4,317,092 | 2/1982 | Potter | 364/724 |
| 4,521,867 | 6/1985 | Kasuga | 364/724 |
| 4,594,725 | 6/1986 | Desperben et al. | 364/724 |

OTHER PUBLICATIONS

Thirion, "Multiplex Digital Filtering Technique" *IBM Tech. Disclosure Bulletin,* vol. 16, No. 12, May 1974, pp. 3942–3943.

Gabel, "A Parallel Arithmetic Hardware Structure for Recursive Digital Filtering" *IEEE Trans. on Acoustics, Speech, and Signal Processing,* Aug. 1974, pp. 159–162.

*Primary Examiner*—David H. Malzahn
*Attorney, Agent, or Firm*—Lewis H. Eslinger; Jay H. Maioli

[57] ABSTRACT

An infinite impulse response (IIR) filter is operative to filter an input signal that comprises a sequence of digital words spaced in time by an interval T. The filter includes delay circuitry that delays the input signal by successive increments of time equal to T so as to cause the production of a series of relatively delayed signals in which each signal is delayed by T with respect to the previous signal in the series. IIR processing units receive respective groups of the series of signals, the groups being offset with respect to one another by one word. The units are operative during each of plural successive clock periods equal to 2T to process respective sets of words obtained from the respective groups of the series of signals so as to produce two output words. A multiplexer combines each two output words produced during each clock period equal to 2T to constitute a filtered output signal comprising a sequence of output words spaced in time by the interval T.

21 Claims, 3 Drawing Sheets

INFINITE IMPULSE RESPONSE FILTERS

BACKGROUND OF THE DISCLOSURE

1. Field of the Invention

This invention relates to infinite impulse response (IIR) filters.

2. Description of the Prior Art

As is known to those skilled in the art, an IIR filter is a type of digital filter which can be used to effect filtration of an input signal that comprises a sequence of digital words (which may, for example, comprise samples of an analog signal) spaced in time by an interval T. The filter is operative during each of a plurality of periods of time (clock periods) equal to T to process sets of relatively delayed words of the input signal to produce a word of a filtered output signal. The IIR filter is distinguished from some other types of digital filter in that it is recursive. That is to say, each output word (or sample) is a function of a past or previously generated word or words as of present and past input words. Accordingly, the IIR filter includes a feedback loop which feeds back at least one word to adding means where it is summed with other signals. In the feedback loop, the word that is fed back is multiplied by a weighting coefficient. The multiplication operation takes time. So does the subsequent addition operation. If the filter is to function, the total of the times taken for addition and multiplication must not exceed T. That is to say, the filter cannot handle an input signal of which the data rate (word or sample frequency) fs is so high that T(=1/fs) is less than the total of the above-mentioned multiplication and addition times. This imposes a severe constraint of the designer of a filter intended to handle a high speed input signal in that even the fastest (and most expensive) multipliers and adding means may not be fast enough.

SUMMARY OF THE INVENTION

An object of the invention is to provide an improved infinite impulse response (IIR) filter.

Another object of the invention is to provide an IIR filter that can handle an input signal whose speed is to high to be handled by a conventional IIR filter.

A further object of the invention is to provide an IIR filter which, while employing a multiplier and adding means which, in a conventional filter, would limit the speed or data rate of the input signal to a predetermined value, can handle an input signal having a speed or data rate having a value considerably greater than the predetermined value.

Yet another object of the invention is to provide an IIR filter which can handle a high speed input signal yet can employ relatively low speed (and therefore relatively inexpensive) components.

The present invention provides an infinite impulse response (IIR) filter for filtering an input signal that comprises a sequence of digital words spaced in time by an interval T. The filter comprises p (e.g. 2) IIR filter portions each operative during each of a plurality of periods of time equal to p.T to process respective sets of adjacent words of the input signal, the sets being offset with respect to one another by one word, so as to produce p output words during each period of time equal to p.T. The filter also comprises a multiplexer for multiplexing together the p output words produced during each period of time equal to p.T to constitute a filtered output signal comprising a sequence of the output words spaced in time by the interval T. By virtue of the fact that the p processing units are operative to produce p output words during periods of time equal to p.T, that is, each processing unit can operate at a data rate equal to the data rate of the input signal divided by p, the time available to form each output word is increased (as compared to the above-described conventional filter) by a factor equal to p. Accordingly, if processing components (multipliers and adders) having the same operating speeds are used, the maximum operating speed of the present IIR filter is increased by a factor of p relative to the above-described conventional type of IIR filter.

The above, and other objects, features and advantages of this invention will be apparent from the following detailed description of illustrative embodiments which is to be read in connection with the accompanying drawings.

DESCRIPTION OF THE PREFERRED EMBODIMENTS

As known to those skilled in the art of digital filter design (see "Theory and Application of Digital Signal Processing", L. R. Rabiner and B. Gold, Prentice-Hall, Inc., 1975), the Z-transfer characteristic H(z) of a one-pole (first order) IIR filter (from which the frequency response can be derived) can be represented by the equation:

$$H(z) = \frac{Y(z)}{X(z)} = \frac{a_0 + a_1 Z^{-1}}{1 + b_1 Z^{-1}} \quad (1)$$

where:

$X(z)$ = the z-transform of a digital input sequence or signal $x(n)$;

$Y(z)$ = the z-transform of a filtered output sequence or signal produced by the filter in response to the input sequence or signal $x(n)$;

$z = e^{j\omega T}$, namely the complex exponential equal to $\cos(\omega T) + j \sin(\omega T)$, where $\omega$ is the angular frequency of a sampled sinusoid (sampling interval T) equivalent to the input sequence or signal $x(n)$;

$a_0, a_1, b_1$ = constants (weighting coefficients of multiplication operations performed in the filter); and $Z^{-1}$ = a delay operator corresponding to a delay of one sampling interval T, which interval is equal to the spacing in time of digital words making up the input signal.

As also is known to those skilled in the art, the operation effected by a first order IIR filter can be represented by the following first order difference equation (which describes the transfer characteristic):

$$y(n) = a_0 x(n) + a_1 x(n-1) - b_1 y(n-1) \quad (2)$$

Figure 1:
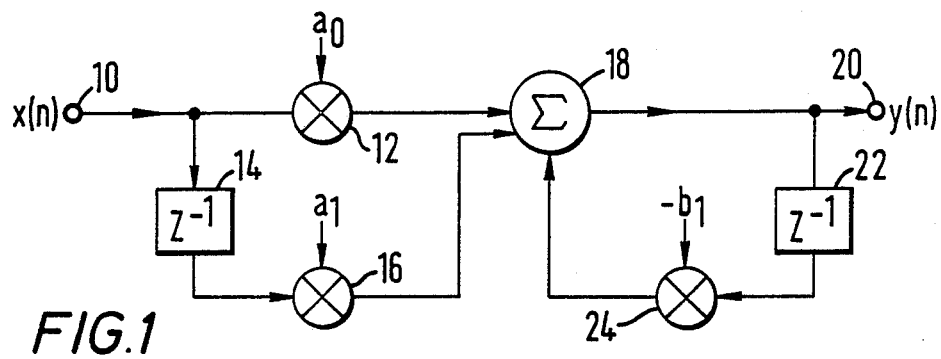
FIG. 1 shows a conventional form of one-pole (first order) IIR filter.

Equations (1) and (2) can be implemented in hardware terms by the structure shown in FIG. 1. In FIG. 1, the input signal x(n), whose z-transform is X(z), is supplied to an input terminal or port 10. The input signal is a sequence of digital words (for example, but not necessarily, 8-bit words) having the spacing T. Each word may for example comprise a digitized sample of an analog signal which is sampled at a frequency fs (=1/T). Since the bits of each word can be considered to arrive in parallel and since the words are transferred between the components of the circuit of FIG. 1 in parallel, it should be appreciated that the various lines shown in FIG. 1 (and in the subsequent figures) are in fact busses or highways having the appropriate bit capacity.

The input signal is passed to a multiplier 12 where each successive word is multiplied by the weighting coefficient $a_0$. The input signal is passed also to a $Z^{-1}$ delay element 14 in which it is subjected to a delay equal to T, namely a one word or sampling period delay. The delay element 14 may comprise a number of latches equal to the number of bits per word, the latches being supplied with a clock or synchronizing signal at the frequency fs (=1/T) from a clock pulse source or circuit (not shown) which is connected also to the other circuit elements shown in FIG. 1 in order to synchronize their operation in a sense to cause "pipelining" of its operation. (As will be known to those skilled in the art, the circuit of FIG. 1 may include further latches (not shown) which are supplied with the clock signal in order to accomplish proper "pipelining". For the sake of simplicity, these latches are omitted from FIG. 1).

The output signal produced by the delay element 14 is passed to a multiplier 16 where each successive word thereof is multiplied by the weighting coefficient $a_1$.

Output signals from the multipliers 12 and 16 which, for each clock period, corresponds to a pair of adjacent words of the input signal (namely the present or current word and the previous word) multiplied by the weighting coefficients $a_0$ and $a_1$, respectively, are passed to respective inputs of an adder or summing means 18. The adder 18, which may comprise a plurality of individual addition units appropriately connected together, produces the output signal or sequence y(n), whose z-transform is Y(z), at an output terminal or port 20.

As indicated above, an IIR filter is recursive in that each output word (or sample) is a function of a past or previously generated word or words as well as present and past input words or samples. To this end, the filter of FIG. 1 includes a feedback loop, connected between the output of the adder 18 and another input of the adder, the adder being operative to sum an output word sent back via the feedback loop with the words from the multipliers 12 and 16. The feedback loop comprises a $Z^{-1}$ delay element 22 (delay time T) and a multiplier 24 in which the output signal from the delay element 22 is multiplied by the weighting coefficient $-b_1$. (The value $+b_1$ (rather than $-b_1$) can instead be applied to the multiplier 24 if the adder is configured to perform an addition operation in which its inputs from the multipliers 12 and 16 are considered positive while its input from the multiplier 24 is considered negative).

It can readily be appreciated by simple mathematical analysis of the circuit of FIG. 1 that it operates in accordance with Equation (1) above. During each clock period (T), the filter of FIG. 1 processes a present and a previous input word and a previous output word to produce a new output word. During each such process, a previous output word that has been delayed by the delay element 22 and multiplied by the weighting coefficient $-b_1$ in the multiplier 24 is added in the adder 18 to words coming from the multipliers 12 and 16. Both the multiplication and addition operations take time. Suppose, for example, that the operation of multiplication in the multiplier 24 takes 100 ns and the operation of addition in the adder 18 takes 40 ns. In this event, for the filter to function, the clock period T must not be less than 140 ns. Accordingly, the filter cannot handle an input signal of which the data rate (input word or sample frequency) fs is greater than $1/140.10^{-9} = 7.14$ MHz. Faster signals can be handled only by increasing the speed of the multiplier and/or adder, which may be difficult and/or excessively expensive and/or impossible.

Figure 2:
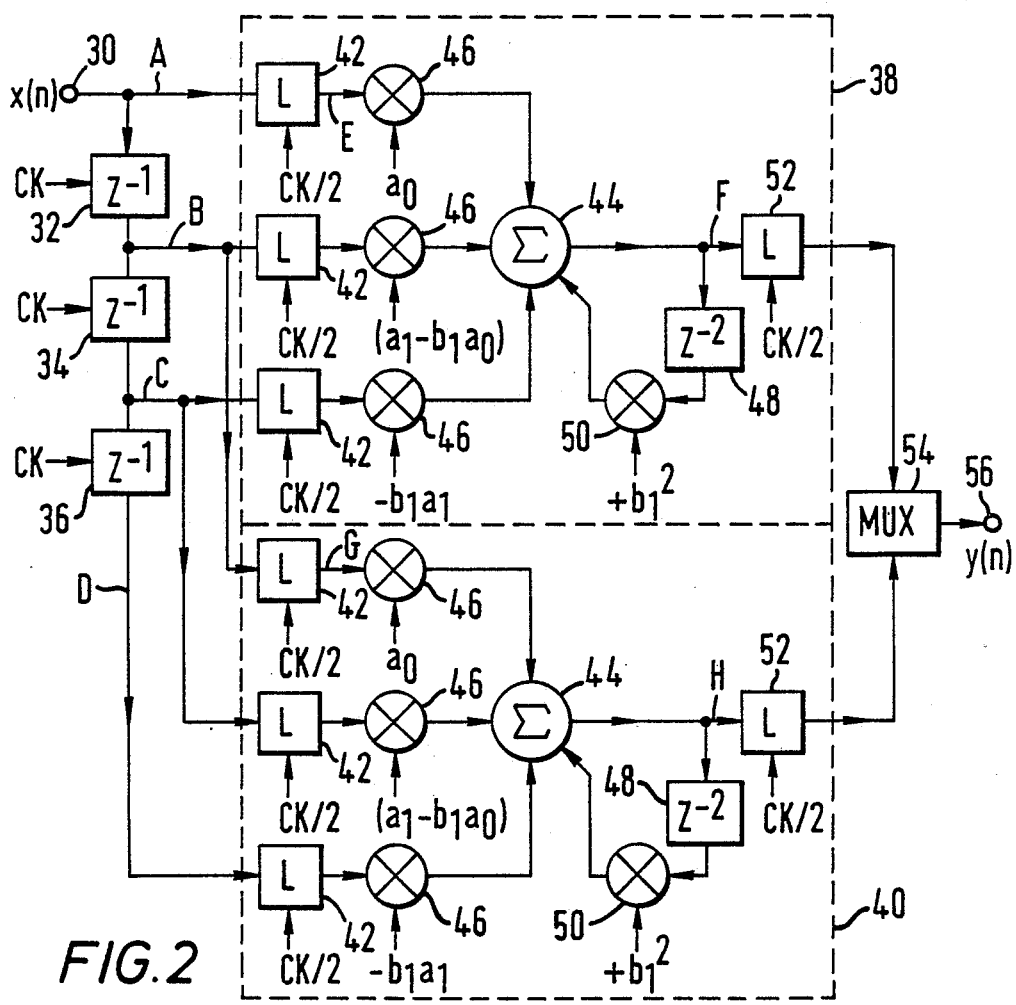
FIG. 2 shows a one-pole IIR filter embodying the present invention.

A modification of the IIR filter of FIG. 1, which considerably relaxes the above-described constraint on the maximum operating speed, is shown in FIG. 2. However, before the circuit of FIG. 2 is described, the mathematical operations which led to its derivation will be explained.

If both the numerator and denominator of Equation (1) above are multiplied by the same quantity, the transfer response will not change. Thus, if both the numerator and denominator are multiplied by the complex conjugate of the denominator (the conjugate of the pole position), namely $(1 - b_1 Z^{-1})$, this gives:

$$H(z) = \frac{(a_0 + a_1 Z^{-1})(1 - b_1 Z^{-1})}{(1 + b_1 Z^{-1})(1 - b_1 Z^{-1})} \quad (3)$$

$$= \frac{a_0 + a_1 Z^{-1} - a_0 b_1 Z^{-1} - b_1 a_1 Z^{-2}}{1 - b_1^2 Z^{-2} - b_1 Z^{-1} + b_1 Z^{-1}} \quad (4)$$

$$= \frac{a_0 + (a_1 - a_0 b_1)Z^{-1} - b_1 a_1 Z^{-2}}{1 - b_1^2 Z^{-2}}, \quad (5)$$

where $Z^{-2}$ is a delay operator corresponding to a delay of two sampling intervals (2T) and the other symbols are as defined above.

The difference equation (second order) corresponding to the transfer characteristic of Equation (5) is:

$$y(n) = a_0 x(n) + (a_1 - a_0 b_1) \times (n-1) - b_1 a_1 x(n-2) + b_1^2 y(n-2) \quad (6).$$

It will be seen that two terms in the denominator of Equation (4) which are functions of $Z^{-1}$ cancel out, leaving in the denominator of Equation (5) only unity and a term which is a function of $Z^{-2}$. Reverting to Equation (1), it will be seen from a comparison of Equation (1) with the circuit of FIG. 1 that the denominator of Equation (1) is representative mathematically of the feedback loop of FIG. 1. Therefore, if it is possible to implement an IIR filter circuit which is generally similar to that of FIG. 1, but which operates in accordance with Equation (5), then since the denominator contains a term which is a function of $Z^{-2}$ (but not a term which is a function of $Z^{-1}$) it should be possible to double the time available for forming each output word. Therefore, for a multiplier and adder operating at the same speeds, the maximum operating speed of the filter also will be doubled.

One possible way of implementing such an IIR filter is shown in FIG. 2. The IIR filter shown in FIG. 2 comprises an input terminal or port 30 to which an input signal x(n) is applied. As before, the input signal x(n) comprises a stream or sequence of digital words or samples spaced in time by the interval (sampling interval) T. The input signal, as present at a point A in FIG. 2, is shown in FIG. 3(A). It comprises a sequence of words $X_{-2}$, $X_{-1}$, $X_o$, $X_1$, $X_2$ etc.

The input signal is directed through a delay means comprising three $Z^{-1}$ delay elements 32, 34, 36 connected in cascade or tandem so as successively to delay it by increments of time equal to T. This results in the generation of a series of four relatively delayed signals in which each signal is delayed by $Z^{-1}$ with respect to the previous signal in the series, namely: the input signal at the point A in FIG. 2, not subject to delay (FIG. 3(A)); the input signal, delayed by $Z^{-1}$, at a point B in FIG. 2 (FIG. 3(B)); the input signal, delayed by $Z^{-2}$, at a point C in FIG. 2 (FIG. 3(C)); and the input signal, delayed by $Z^{-3}$, at a point D in FIG. 2 (FIG. 3(D)).

Two IIR processing units 38, 40 are connected to receive respective groups of the series of four relatively delayed signals available at the points A to D. Specifically, the unit 38 receives the group of signals at the points A to C and the unit 40 receives the group of signals at the points B to D, the two groups thus being offset with respect to one another by one word.

The two IIR processing units 38, 40 are preferably, as shown, of substantially identical construction. Each unit comprises three latches 42, each having a bit capacity appropriate to the number of bits in each word of the input signal, so as to latch into each unit 38, 40 under the control of a clock signal CK/2 (FIG. 3), words from the appropriate group (A to C or B to D) of the series of four relatively delayed signals. In each unit 38, 40, the outputs of the latches 24 are connected to respective inputs of an adder 44 via respective multipliers 46 having weighting coefficients $a_o$, $(a_1-b_1a_o)$ and $-b_1a_1$ which correspond to those in the numerator of Equatio (5) above.

In like manner to FIG. 1, the output of each adder 44 is connected back to a further input of the adder via a feedback loop comprising a delay element 48 and a multiplier 50. Note, however, that in this case the delay element 48 is a $Z^{-2}$ delay element and therefore produces a delay of 2T. Note also that the weighting coefficient of the multiplier 50 is $+b_1^2$, which is that appearing in the final term of the difference equation, namely Equation (6).

The outputs of the adders 44 are connected via respective latches 52 (supplied with the clock signal CK/2) to respective inputs of a multiplexer 54 which has an output terminal or port 56 at which the filter output signal y(n) of the filter is produced.

The manner of operation of the IIR filter of FIG. 2 will now be described. It will, however, first be observed that the clock signal CK/2, which is supplied to the latches 42, 52 and other components of the processing units 38, 40, has a frequency that is half the frequency or data rate fs of the input signal. This is, the period of the clock signal CK/2 is equal to 2T. Accordingly, in order that the delay elements 32, 34, 36 will produce delays of $Z^{-1}$, they are supplied with a clock signal CK having a frequency (equal to fs) that is twice that of the clock signal CK/2. The delay elements 32, 34, 36 can in fact be of the same construction as the latches 42, 52, which are used to pipeline the various signals through the processing units 38, 40, the sole functional difference between them being that they are supplied with clock signals (CK and CK/2, respectively) of different frequencies.

As will now be described, the latches 42, in conjunction with the delay elements 32, 34, 36, serve effectively to demultiplex the input signal so that, during each of the clock periods (2T) of the clock signal CK/2, the processing units 38, 40 can process simultaneously or contemporaneously, that is in parallel, respective sets of words of the input signal which are offset by one word and which, in the conventional IIR filter of FIG. 1, have to be processed (at twice the speed) during successive clock periods equal to T. This effective halving of the data rate of the processing unit 38, 40, which is achievable by virtue of the fact that it implements Equation (5) which has no term for $Z^{-1}$ in its denominator (feedback loop), is what enables relaxation of the constraint on the maximum operation speed of the filter to be achieved.

Figure 3:
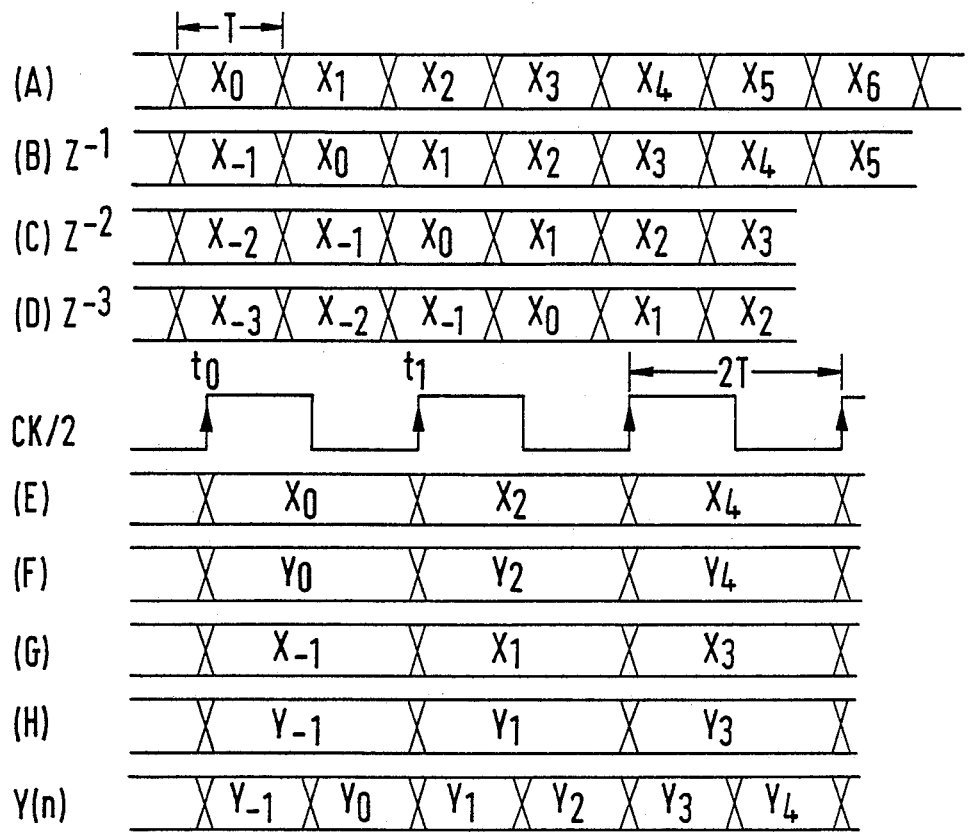
FIG. 3 shows signals present at various places within the filter of FIG. 2.

The clock signal CK/2 is depicted in FIG. 3 as comprising a series of clock pulses. As explained above, it has a period equal to 2T and therefore has a frequency which is half the data rate fs of the input signal. As represented by the arrows in FIG. 3, the clock signal becomes effective upon the latches 42 (and the other circuits to which it is connected) at the leading edges of the clock pulses thereof. Assume that, just prior to one such edge occurring at a time $t_o$, the words $X_o$, $X_{-1}$ and $X_{-2}$ are stored in the latches 42 of the unit 38 and the words $X_{-1}$, $X_{-2}$ and $X_{-3}$ are stored in the latches 42 of the unit 40. At the time $t_o$, these various words are released from the latches 42 and processed by the units 38, 40. At this time, the work $X_o$ is thus present at a point E in FIG. 2 (see FIG. 3(E)) and the word $X_{-1}$ is present at a point G in FIG. 2 (see FIG. 3(G)).

As can be seen from examining FIG. 2, during the succeeding clock period (between the instant $t_o$ and an instant $t_1$) the processing unit 38 produces an output word $Y_o$ (FIG. 3(F)) which is based upon the set of input words $X_o$, $X_{-1}$ and $X_{-2}$ and which conforms to Equation (5). Likewise, during the same clock period, the processing unit 40 produces an output word $Y_{-1}$ (FIG. 3(H)) which is based upon the set of input words $X_{-1}$, $X_{-2}$ and $X_{-3}$ and which also conforms to Equation (4). Since the output words $Y_{-1}$ and $Y_0$ are produced contemporaneously (in parallel) during a clock period equal to 2T, the components of the processing units have twice as much time to carry out their operations as has the conventional circuit of FIG. 1 where the two words are produced successively in consecutive clock periods equal to T. As indicated above, the reduction in speed is achievable by virtue of the fact that the feedback loop does not need to incorporate a $Z^{-1}$ delay element but, in this embodiment, comprises a single $Z^{-2}$ delay element 48. (The $Z^{-2}$ delay element 48 may comprise a latch similar to the latches 42, 52 and supplied with the same clock signal CK/2).

The output words $Y_o$ and $Y_{-1}$ produced by the processing units 38, 40, respectively, are passed via the latches 52 to the multiplexer 54 where they are multiplexed together in the proper order, at the full data rate fs, to produce the output word sequence y(n): see FIG. 3.

Note that, in spite of the fact that the input signal of the filter of FIG. 2 is, in effect, demultiplexed, this does not involve skipping any words of the input signal. This would not be acceptable. The filter of FIG. 2 effectively filters the input signal in the same way as that of FIG. 1, that is it has the same transfer response, but it does so by processing pairs of words in parallel (at a reduced rate)

rather than by processing sets of words serially (at the full rate).

The IIR filter of FIG. 2, in summary, displays the advantage that it has twice as much time available to produce each output word as has the conventional IIR filter of FIG. 1 so that, for the same operation times of the relevant circuit components, the maximum signal frequency or data rate that it can handle is doubled.

More generally, the filter circuit of FIG. 2 runs p times more slowly than the input data rate (where p=2 in this case) by using a technique in which the denominator $X(z)$ of the equation representing the transfer characteristic governing the operation of the filter is made a function of $Z^{-p}$. The same technique can be extended to higher values of p (probably only corresponding to integral powers of 2). For example, the denominator $X(z)$ of the transfer characteristic equation might be reduced to a function of $Z^{-4}$, in which case the data rate would be reduced by a factor of four (p=4) and four processing units would be employed to process four sets of input words in parallel or contemporaneously. Similarly, the denominator might be reduced to a function of $Z^{-8}$, in which case the data rate would be reduced to a factor of eight (p=8) and eight processing units would be employed to process eight sets of input words in parallel. More generally, the denominator $X(z)$ of the transfer characteristic may be reduced to an expression of the form $$X(z) = 1 + (-1)^{p/2} \cdot b_1^p \cdot Z^{-p} \qquad (30)$$

whereby the data rate can be reduced by a factor of p (where p is an integral multiple of 2) and p processing units would be employed to process p sets of input words in parallel. Obviously, however, for higher values of p than 2 the numerator $Y(z)$ of the transfer characteristic equation would become much more complex in order to obtain the same filter response.

The foregoing part of this specification has dealt with the application of the present invention to one-pole IIR filters. The invention is, however, applicable to IIR filters of a more complex nature. An example will now be given of how the invention is applicable to two-pole IIR filters.

The transfer characteristic of a two-pole (second order) IIR filter can be represented by the equation:

$$H(z) = \frac{X(z)}{Y(z)} = \frac{a_0 + a_1 Z^{-1} + a_2 Z^{-2}}{1 + b_1 Z^{-1} + b_2 Z^{-2}}, \qquad (7)$$

where $a_2$ and $b_2$ represent further constants (weighting coefficients) and the other symbols are as defined above.

The difference equation (second order) corresponding to the transfer characteristic of Equation (7) is:

$$y(n) = a_0 x(n) + a_1 x(n-1) + a_2 x(n-2) - b_1 y(n-1) - b_2 y(n-2) \qquad (8).$$

Figure 4:
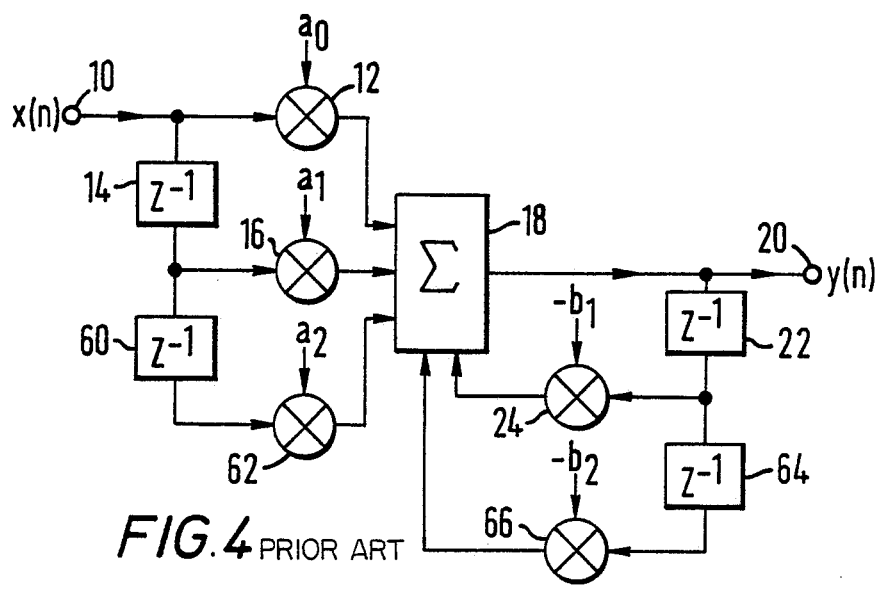
FIG. 4 shows a conventional form of two-pole (second order) IIR filter.

One example of a structure by which Equations (7) and (8) can be implemented in hardware terms is shown in FIG. 4. This structure is similar in many respects to that of FIG. 1 and will be described only in so far as it differs from that of FIG. 1. In FIG. 4, components which are the same as or similar to components of the filter of FIG. 1 are represented by the same references.

The structure of FIG. 4 is similar to that of FIG. 1 except that:

(i) a further $Z^{-1}$ delay element 60 and a further multiplier 62 (weighting coefficient $a_2$) are connected as shown to produce the third term in the numerator of Equation (7); and (ii) the feedback loop comprises a further $Z^{-1}$ delay element 64 and a further multiplier 66 (weighting coefficient $-b_2$) connected as shown to produce the third term in the denominator of Equation (7).

In order to produce a version of the two-pole filter of FIG. 4 which can be demultiplexed to run at a lower data rate, it is necessary to find an expression which, when multiplied with each of the numerator and denominator of Equation (7), gives rise to a transfer characteristic equation (on which a circuit can be based) which has a denominator that does not contain a term which is a function of $Z^{-1}$. Specifically, an expression which results in the denominator becoming a function of $Z^{-2}$ and $Z^{-4}$ only would be suitable. One such expression is $(1 - b_1 Z^{-1} + b_2 Z^{-2})$.

Multiplying both the numerator and denominator of Equation (7) by $(1 - b_1 Z^{-1} + b_2 Z^{-2})$ gives:

$$\begin{aligned} H(z) &= \frac{(a_0 + a_1 Z^{-1} + a_2 Z^{-2})(1 - b_1 Z^{-1} + b_2 Z^{-2})}{(1 + b_1 Z^{-1} + b_2 Z^{-2})(1 - b_1 Z^{-1} + b_2 Z^{-2})} \\ &= \{a_0 + (a_1 - a_0 b_1) Z^{-1} + (a_0 b_2 - a_1 b_1 + a_2) Z^{-2} + \\ &\quad (a_1 b_2 - a_2 b_1) Z^{-3} + b_2 a_2 Z^{-4}\} / \{1 - b_1 Z^{-1} + \\ &\quad b_2 Z^{-2} + b_1 Z^{-1} - b_1^2 Z^{-2} + b_1 b_2 Z^{-3} + b_2 Z^{-2} - \\ &\quad b_1 b_2 Z^{-3} + b^2 Z^{-4}\}. \end{aligned} \qquad (9)$$

It will be seen that the terms in the denominator of Equation (9) which are a function of $Z^{-1}$ and $Z^{-3}$ cancel out, leaving only unity and functions of $Z^{-2}$ and $Z^{-4}$.

Modifying Equation (9) by performing the above-mentioned cancellations and simplifying the constants gives:

$$H(z) = \frac{w_0 + w_1 Z^{-1} + w_2 Z^{2} + w_3 Z^{-3} + w_4 Z^{-4}}{1 + v_1 Z^{-2} + v_2 Z^{-4}}, \qquad (10)$$

where:
$w_0 = a_0$;
$w_1 = a_1 - a_0 b_1$;
$w_2 = a_0 b_2 - a_1 b_1 + a_2$;
$w_3 = a_1 b_2 - a_2 b_1$;
$w_4 = b_2 a_2$;
$v_1 = 2b_2 - b_1^2$; and
$v_2 = b_2^2$.

The difference equation (fourth order) corresponding to the transfer characteristic of equation (9) is:

$$y(n) = w_0 x(n) + w_1 x(n-1) + w_2 x(n-2) + w_3 x(n-3) + w_4 x(n-4) - v_1 y(n-2) - v_2 y(n-4) \qquad (11).$$

As will be appreciated from the foregoing, Equation (10) can be implemented in hardware terms in such a manner that the feedback loop contains only functions of $Z^{-2}$ and $Z^{-4}$ (in practice implemented as two $Z^{-2}$ delay elements connected in cascade), the implementation being a demultiplexed version of FIG. 4 running at half the data rate in like manner to that in which the one-pole implementation of FIG. 2 is a demultiplexed version of FIG. 1 running at half the data rate.

Figure 5:
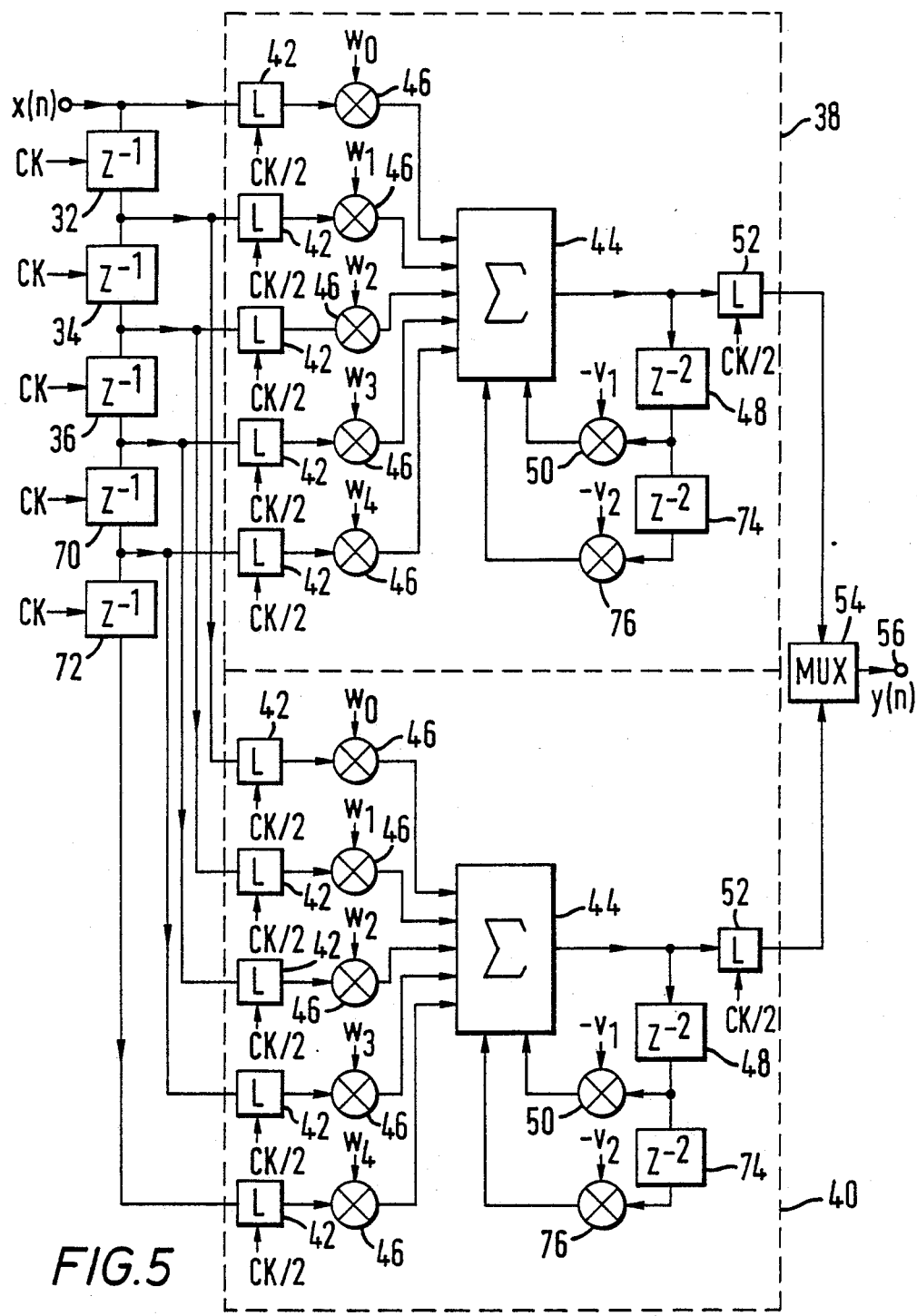
FIG. 5 shows a two-pole IIR filter embodying the present invention.

One example of a structure by which Equations (10) and (11) can be implemented is shown in FIG. 5. The structure of FIG. 5 is similar in many respects to that of FIG. 2 and will only be described in so far as it differs from that of FIG. 2. In FIG. 5, components which are the same as or similar to components of the filter of FIG. 2 are represented by the same references.

The structure of FIG. 5 is similar to that of FIG. 2 except that, in each of the IIR processing units 38, 40:

(i) the delay means comprises two further $Z^{-1}$ delay elements 70, 72 connected in cascade or tandem with the $Z^{-1}$ delay elements 32, 34, 36 in view of the fact that the numerator of Equation (10) differs from that of Equation (7) by virtue of its having extra terms which are functions of $Z^{-3}$ and $Z^{-4}$;

(ii) the weighting coefficients for the upper three multipliers 46 are the coefficients $w_o$, $w_1$ and $w_2$ of Equation (10), rather than the coefficients $a_o$, $a_1$ and $a_2$ of Equation (5);

(iii) two further latches 24 and multipliers 46 (weighting coefficients $w_3$ and $w_4$) are connected as shown;

(iv) the weighting coefficient of the multiplier 48 of the feedback loop is the coefficient $-v_1$ of Equation (10); and (v) the feedback loop comprises a further $Z^{-2}$ delay element 74 connected in cascade or tandem with the $Z^{-2}$ delay element 48 and a further multiplier 76 (weighting coefficient $-v_2$) connected as shown to produce the third term in the denominator of Equation (10).

The filter of FIG. 5 functions in a manner very similar to that of FIG. 2 to replicate the response of the conventional two-pole filter of FIG. 4, but in such a manner that, during each clock period equal to 2T, a pair of sets of words are processed in parallel (at a halved data rate) instead of such pair being processed consecutively (at the full data rate) in respective consecutive clock periods equal to T. Thus the filter of FIG. 5 displays the same advantage over that of FIG. 4 that the filter of FIG. 2 displays over that of FIG. 1, namely it has twice as much time to generate output signal words as does the filter of FIG. 4 so that, for the same operating times of the relevant circuit components, the maximum input signal frequency or data rate that it can handle is doubled.

The principle underlying the design of the filter of FIG. 5 can be extended to provide filters running p times (where p is greater than 2 and probably is an integral power of 2) more slowly than the full (input) data rate. For example, the denominator $X(z)$ of the transfer characteristic equation governing the operation of the filter might be reduced to functions of $Z^{-4}$ and $Z^{-8}$ (or $Z^{-8}$, $Z^{-16}$ etc.), in which case the data rate would be reduced by a factor of 4 (8, etc.) and 4 (8, etc.) processing units would be employed to process 4 (8, etc.) of input words in parallel or contemporaneously. More generally, the denominator $X(z)$ can be made a function of Z which is of order 2p so as to contain terms for Z which are powers of $-p$ and $-2p$. Obviously, however, for values of p higher than 2 the numerator of the equation would become much more complex in order to obtain the same filter response.

It should be appreciated that, in each of the embodiments of FIGS. 2 and 5, each of the IIR processing units 38, 40, in conjunction with a respective part of the delay means 32,34,36 or 32,34,36,70,72, constitutes a respective demultiplexed IIR filter or filter portion that implements Equation (5) or Equation (10), but with the groups of adjacent words processed by the two units being offset with respect to one another by one word. For exaple, in the case of FIG. 2, the processing unit 38 and the delay elements 32,34 form one IIR filter portion and the processing unit 40 and the delay elements 32,34,36 form the other IIR filter portion. In the implementations of FIGS. 2 and 5, the delay means is shared between the IIR filter portions to provide hardware economy, because incorporating a separate delay means in each IIR filter portion would increase the number of delay elements in that, in FIG. 2, the three delay elements, 32,34,36 would have to be replaced by five elements (two in the unit 38 and three in the unit 40) and, in FIG. 5, the five delay elements 32,34,36,70,72 would have to be replaced by nine elements (four in the unit 38 and five in the unit 40). Nonetheless, it should be appreciated that the IIR processing units 38,40 and the shared delay means could be replaced by respective IIR filter portions including respective individual delay means. Such an arrangement may in fact be considered preferable in some cases in that it may enable the filter to be implemented in hardware terms as two or more substantially identical portions which might be formed as respective substantially identical circuit assemblies such as circuit boards.

It should be appreciated that the invention can be embodied in other ways than those described above with reference to FIGS. 2 and 5. For instance, the circuits as shown in FIGS. 2 and 5 can be transformed into alternative structures by using a transposition (flow graph reversal) technique: see "Digital Signal Processing", A. V. Oppenheim and R. W. Schafer, Prentice-Hall, Inc., 1795 at pages 130 to 160. While alternative structures obtained by transposition will be of substantially different form than the structures shown in FIGS. 2 and 5, they will function equivalently and have the same transfer characteristics as the structures of FIGS. 2 and 5.

Moreover, once the mathematical process of deriving a denominator $X(z)$ of the suitable form for the transfer characteristic equation has been completed, the process of implementing the equation can take routes different from those described above. Consider, for example, the two-pole demultiplexed filter of FIG. 5. The structure of FIG. 5, which is an implementation of Equation (10), was based upon the structure of the non-demultiplexed two-pole filter of FIG. 4, which is an implementation of Equation (7). However, as known to those skilled in the art, Equation (7) can be implemented in other forms than that shown in FIG. 4. Therefore, it may be possible to construct a filter that functions equivalently to that of FIG. 5, in that it is an implementation of Equation (10), but which is of a rather different structure in that it is based upon the structure of some other implementation of Equation (7) than that shown in FIG. 4.

More generally, therefore, a filter embodying the invention can be designed by the following technique. A basic or non-demultiplexed form is chosen and a desired response of the filter is selected by calculating suitable values for the weighting coefficients of the transfer characteristic equation of the basic or non-demultiplexed form. An expression (such as the conjugate of the pole position of $X(z)$) is then found which, when it is multiplied with both the numerator $Y(z)$ and denominator $X(z)$ of the basic transfer characteristic equation, leads to the transformation of the basic equation into a modified equation which has a denominator X(z) of the form $$X(z) = 1 + \sum_{i=1}^{L} b_i Z^{-ip}. \quad (12)$$

where p is equal to 2 or an integral power of 2 and represents the number of ways in which th filter is demultiplexed, that is the number of IIR processing portions that are employed to produce simultaneously p words of the output signal, and L is equal to the number of poles of the basic or original transfer characteristic. The modified equation corresponds to a demultiplexed filter or filter portion having an order m.p (where m is the order of the basic or non-demultiplexed form of the filter). The modified equation is then implemented in any desired way to form an IIR filter portion or to form an IIR processing unit that shares its delay means with its (p−1) counterparts. Preferably, the same implementation is used for each of the p processing units or filter portions so that they will all be of substantially identical construction. However, it should be appreciated that, in principle, the modified equation could be implemented in more than one way so as to form processing units or filter portions of different constructions. A multiplexer is then associated with the p filter portions (that is p separate filter portions or p processing units sharing a common delay means) to form the complete demultiplexed filter.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. An infinite impulse response (IIR) filter for filtering an input signal that comprises a sequence of digital words spaced in time by an interval T, said filter comprising:
   a plurality p of IIR filter circuit means each operative during each of a plurality of periods of time equal to p.T for processing respective sets of adjacent words of the input signal, the sets being offset with respect to one another by one word, and for producing p output words during each said period of time; and
   means for multiplexing together said p output words producing during each said period of time equal to p.T to constitute a filtered output signal comprising a sequence of said output words spaced in time by said interval T.

2. An IIR filter according to claim 1, wherein p=2.

3. An IIR filter according to claim 1, wherein p is a positive integer power of 2.

4. An IIR filter according to claim 1, wherein each of said p IIR filter circuit means comprises summing means and a feedback loop connected between an output and at least one input of said summing means, said feedback loop comprising at least one delay element that produces a delay equal to p.T and a multiplier connected between an output of said at least one delay element and an input of said summing means.

5. An IIR filter according to claim 4, which is a one-pole filter, wherein said feedback loop comprises a single delay element that produces a delay equal to p.T and a single multiplier connected between an output of said delay element and an input of said summing means.

6. An IIR filter according to claim 4, which is a two-pole filter, wherein said feedback loop comprises two delay elements that each produce a delay equal to pT and two multipliers, said two delay elements being connected in cascade and an output of each of said delay elements being connected to a respective input of said summing means by a respective one of said two multipliers.

7. An IIR filter according to claim 4, wherein p=2.

8. An IIR filter according to claim 4, wherein p is a positive integer power of 2.

9. An IIR filter according to claim 4, wherein each of said p IIR filter circuit means comprises a plurality of multipliers each having an output connected to a respective input of said summing means.

10. An IIR filter according to claim 9, wherein p=2.

11. An IIR filter according to claim 9, wherein p is a positive integer power of 2.

12. An IIR filter according to claim 1, wherein said IIR filter further comprises:
    delay means for delaying said input signal by successive increments of time equal to T so as to cause the production of a series of relatively delayed signals in which each signal is delayed by T with respect to the previous signal in the series; and wherein said p IIR filter circuit means are each connected to receive a respective group of said series of relatively delayed signals, said groups being offset with respect to one another by one word.

13. An IIR filter according to claim 12, wherein p=2.

14. An IIR filter according to claim 12, wherein p is a positive integer power of 2.

15. An IIR filter according to claim 4, wherein said IIR filter further comprises:
    delay means for delaying said input signal by successive increments of time equal to T so as to cause the production of a series of relatively delayed signals in which each signal is delayed by T with respect to the previous signal in the series; and wherein said p IIR processing circuit means are each connected to receive a respective group of said series of relatively delayed signals, said groups being offset with respect to one another by one word.

16. An IIR filter according to claim 15, wherein p=2.

17. An IIR filter according to claim 15, wherein p is a positive integer power of 2.

18. An IIR filter according to claim 9, wherein said IIR filter further comprises:
    delay means for delaying said input signal by successive increments of time equal to T so as to cause the production of a series of relatively delayed signals in which each signal is delayed by T with respect to the previous signal in the series; and wherein said p IIR processing circuit means are each connected to receive a respective group of said series of relatively delayed signals, said groups being offset with respect to one another by one word.

19. An IIR filter according to claim 18, wherein p=2.

20. An IIR filter according to claim 18, wherein p is a positive integer power of 2.

21. An infinite impulse response (IIR) filter for filtering an input signal that comprises a sequence of digital words spaced in time by an interval T, said filter comprising:

two IIR filter circuit means each comprising summing means and a feedback loop connected between an output and at least one input of said summing means, said feedback loop comprising at least one delay element that produces a delay equal to 2T and a multiplier connected between an output of said least one delay element and an input of said summing means, each of said IIR filter circuit means being operative during each of a plurality of periods of time equal to 2T to process respective sets of adjacent words of the input signal, the sets being offset with respect to one another by one word, so as to produce two output words during each said period of time; and means for multiplexing together with said two output words produced during each said period of time equal to 2T to constitute a filter output signal comprising a sequence of said output words spaced in time by said interval T.

* * * * *

UNITED STATES PATENT AND TRADEMARK OFFICE
CERTIFICATE OF CORRECTION

PATENT NO.   : 4,811,263
DATED        : March 7, 1989
INVENTOR(S)  : David J. Hedley et al.

It is certified that error appears in the above-identified patent and that said Letters Patent is hereby corrected as shown below:

Column 1, line 43, change "to" should read -- too --.
Column 3, line 37, change "corresponds" to --correspond--.
Column 5, line 35, change "Equatio" to --Equation--;
        line 50, change "filter" to --filtered--.
Column 7, line 6, change "operation" to --operating--.
Column 8, line 33, change "$b^2z$" to --$b_2^2z$--;
        line 55, change "equation" to --Equation--.
Column 10, line 4, change "exaple" to --example--.
Column 11, line 9, change "th" to --the--.

IN CLAIMS
Column 11, line 50, change "producing" to --produced--.

Signed and Sealed this

Twenty-eighth Day of November 1989

Attest:

JEFFREY M. SAMUELS

Attesting Officer    Acting Commissioner of Patents and Trademarks